United States Patent [19]

Pankove

[11] Patent Number: 4,977,433

[45] Date of Patent: Dec. 11, 1990

[54] OPTOELECTRONIC SEMICONDUCTOR DEVICE

[75] Inventor: Jacques I. Pankove, Boulder, Colo.

[73] Assignee: University of Colorado Foundation, Inc., Boulder, Colo.

[21] Appl. No.: 428,388

[22] Filed: Oct. 27, 1989

[51] Int. Cl.$^5$ .................... H01L 29/205; H01L 31/06
[52] U.S. Cl. ......................................... 357/16; 357/17
[58] Field of Search ....................... 357/16, 17, 38, 30; 338/16

[56] References Cited

U.S. PATENT DOCUMENTS

| 4,152,713 | 5/1979 | Copeland, III et al. | 357/19 |
| 4,163,241 | 7/1979 | Hutson | 357/38 |
| 4,910,571 | 3/1990 | Kasahara et al. | 357/17 |

FOREIGN PATENT DOCUMENTS

| 0093262 | 7/1980 | Japan | 357/38 |
| 0059772 | 4/1985 | Japan | 357/17 |

Primary Examiner—Jerome Jackson, Jr.
Assistant Examiner—Carl Whitehead, Jr.
Attorney, Agent, or Firm—Donald S. Cohen; Earl C. Hancock

[57] ABSTRACT

An optoelectronic device having an optical switch which can be turned on and off optically by a beam of light. The device includes the optical switch having a first optically variable resistance device connected in series with the switch and one side of a source of current, and a second optically variable resist device connected in series with the switch and one side of a source of current, and a second optically variable resistance device connected in series with the switch and the other side of the current source. The switch is capable of emitting light when a voltage above a threshold is applied thereto. By directing a light into the first optically variable resistance device the voltage applied across the switch is increased to a level just below the threshold and is raised to at least the threshold by directing a light into the switch so as to turn on the switch. The switch is turned off by directing a beam of light into the second optically variable resistance device which reduces the voltage applied across the switch below a holding voltage.

14 Claims, 1 Drawing Sheet

OPTOELECTRONIC SEMICONDUCTOR DEVICE

FIELD OF THE INVENTION

The present invention relates to an optoelectronic semiconductor device, and, more particularly to a semiconductor optical switch which is completely operated optically.

BACKGROUND OF THE INVENTION

Optoelectronic semiconductor devices which emit a beam of light when optically actuated have been developed. One such device is described in U.S. Pat. No. 4,152,713 to John A. Copeland, III et al, issued May 1, 1979, entitled UNIDIRECTIONAL OPTICAL DEVICE AND REGENERATOR. This device includes a body of a semiconductor material having four layers of alternating opposite conductivity type, i.e. PNPN or NPNP, forming PN junctions between adjacent layers. Preferably, the inner two layers are made of a direct-gap semiconductor material, and the outer two layers are made of a wider-band-gap material so as to form a heterojunction between the outer two layers and each of the inner two layers. These heterojunctions act to confine electrons in the inner two layers where they are converted to photons. The photons are emitted from the device as a beam of light. The device is operated by applying a voltage across the device which is lower than the threshold voltage necessary in the dark to turn on the device and generate light. A beam of light is directed into the device which lowers the threshold voltage and thereby causes light to be generated in the device. The light is then emitted from the device as a beam. Although the device is turned on by directing a beam of light therein, it can only be turned off by removing the electrical input. Thus, to operate the device for optical communication purposes, the electrical input must be pulsed. Since the device is intended to be an optically operated device, it would be desirable to be able to turn the device both off and on optically.

SUMMARY OF THE INVENTION

An optoelectronic semiconductor device which is capable of being turned on and off optically includes a semiconductor device capable of generating light when operated above a threshold voltage and means for applying an electrical voltage across the device at a level below the threshold. A first optically variable resistance device is electrically connected in series with the semiconductor device and one side of a source of current, and a second optically variable resistance device is electrically connected in series with the semiconductor device and the other side of the source of current. When light is directed into the first optically variable resistance device, the voltage across the semiconductor device is increased so that light directed into the semiconductor device will turn on the semiconductor device and generate light therein. Light directed into the second optically variable resistance device lowers the voltage across the semiconductor device so as to turn the semiconductor device off.

DETAILED DESCRIPTION OF PREFERRED EMBODIMENTS

Figure 1:
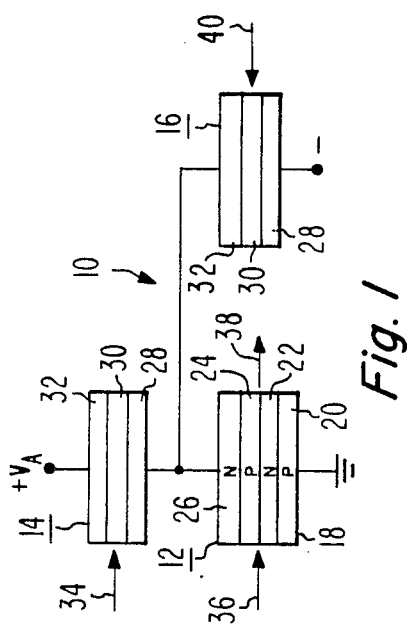
FIG. 1 is a schematic diagram of the optoelectronic device of the present invention.

Referring to FIG. 1, the optoelectronic device 10 of the present invention basically comprises an optical switch 12, a first optically variable resistance device 14 electrically connected in series with the optical switch 12 and one side of a current source, and a second optically variable resistance device 16 electrically connected in series with the optical switch 12 and the other side of the current source. The optical switch 12 is similar to that shown in U.S. Pat. No. 4,152,713 in that it comprises a body 18 of a semiconductor material having four layers 20, 22, 24, and 26 of alternating opposite conductivity types, such as PNPN, forming PN junctions between adjacent layers. Preferably, the outer two layers 20 and 26 are of a wider energy band-gap material, such as aluminum gallium arsenide (AlGaAs) and the two inner layers 22 and 24 are of a narrow energy band-gap material, such as gallium arsenide (GaAs) Thus, the two inner layers 22 and 24 form a homojunction with each other, and each of the outer layers 20 and 26 forms a heterojunction with its adjacent inner region 22 and 24 respectively.

Preferably, each of the first and second optically variable resistance devices 14 and 16 is a semiconductor photoconductor. As shown, the optically variable resistance devices 14 and 16 are phototransistors having three layers 28, 30 and 32 of alternating opposite conductivity types, such as PNP or NPN devices. However, the optically variable resistance devices can be any type of photoconductors formed of amorphous or crystalline semiconductor materials having one or more PN junctions. The first variable resistance device 14 has one side connected to the positive terminal of a current source and its other side connected to one side of the optical switch 12. The other side of the optical switch 12 is connected to ground. The second variable resistance device 16 has one side connected to the one side of the optical switch 12 and its other side connected to the negative terminal of a current source.

In the operation of the optical switch 12, a voltage is applied across the body 18 in a direction so as to reverse bias the PN junction between the two inner layers 22 and 24 and to forward bias each of the PN heterojunctions between the outer layers 20 and 26 and its respective inner layer 22 and 24. If the applied voltage is increased high enough, breakdown will result from either avalanching (when a critical field is exceeded at the reverse-biased junction), or from punch-through (when a depletion layer extends to the nearest forward-biased heterojunction. After such a breakdown, double injection occurs, which floods the two inner regions 22 and 24 with electrons and holes that are stopped by the potential barriers at the heterojunctions between each of the inner regions 22 and 24 and its adjacent outer region 20 and 26. This results in the generation of light in the body 18.

However, in the optical switch 12, the voltage applied across the body 18 is at a level below that which will cause breakdown. Light is then directed into the body 18. The photons from the light are absorbed in the inner regions 22 and 24 inducing the breakdown. The presence of a high electric filed in the junction lowers the photon energy to which the device is sensitive, the Franz-Keldysh effect. Essentially, the absorbed photons produce electron-hole pairs that are separated by the electric filed. These charges accumulate on either side of the PN junction, lowering the potential barrier to the injection of carriers from the outer regions 20 and 26. This results in double-injection and light is generated in the body 18.

In the optoelectronic device 10 of the present invention, the voltage increase across the optical switch 12 is obtained by directing a beam of light into the first optically variable resistance device 14 as indicated by the arrow 34. This lowers the resistance across the first variable resistance device 14 to achieve a flow of current therethrough, which, in turn, results in the desired voltage being applied across the optical switch 12. Thus, when a beam of light is directed into the optical switch 12, as indicated by the arrow 36, light is generated in the optical switch 12 which is emitted as a beam indicated by the arrow 38. To turn off the optical switch 12, a beam of light is directed into the second optically variable resistance device 16 as indicated by the arrow 40. This lowers the resistance across the second optically variable resistance device 16 causing some of the current which is flowing across the first optically variable resistance device 14 to flow across the second optically variable resistance device 16. This lowers the voltage across the optical switch 12 below the holding voltage causing it to turn off. The holding voltage is that voltage below which the optical switch 12 will turn off.

Figure 2:
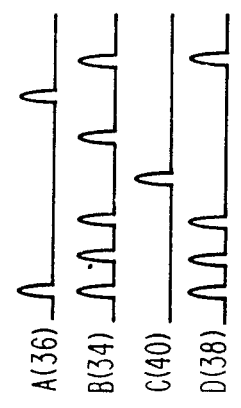
FIG. 2 is a diagram illustrating the manner of operating the device.

The operation of the optoelectronic device 10 of the present invention is shown by the time lines in FIG. 2. The line A indicates light input into the optical switch 12, line B the optical input into the first variable resistance device 14, line C the optical input into the second variable resistance device 16 and line D the optical output of the optical switch 12. When both optical pulses are directed into both the optical switch 12 and the first optically variable resistance device 14, a pulse of light is obtained from the optical switch 12. Additional optical pulses directed into the optically variable resistance device 14 achieve additional pulses of light output from the optical switch 12. However, when a pulse of light is directed into the second optically variable resistance device 16, the optical switch 12 is turned off and additional pulses of light into the first optically variable resistance device 14 does not produce a light output from the optical switch 12. It is not until light pulses are directed into both the optical switch 12 and the first optically variable resistance device 14 that light output is again achieved from the optical switch 12. Thus, in the optoelectronic device 10 of the present invention, the optical switch 12 is turned both on and off optically.

Figure 3:
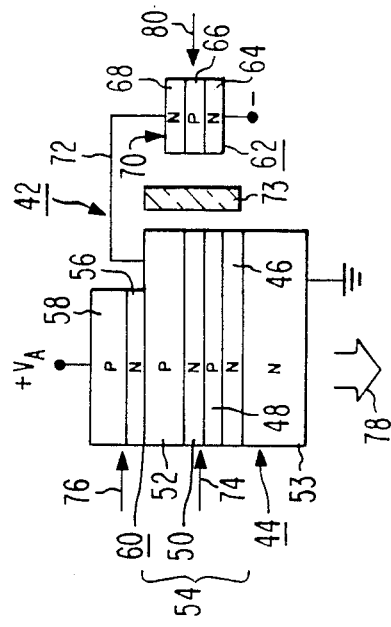
FIG. 3 is a sectional view of a semi-monolithic form of the optoelectronic device of the present invention.

Referring to FIG. 3, a semi-monolithic form of an optoelectronic device of the present invention is generally designated as 42. The optoelectronic device 42 comprises a body 44 of a semiconductor material having four superimposed layers 46, 48, 50 and 52 of alternating opposite conductivity type, such as NPNP, on a substrate 53 forming PN junctions between adjacent layers. This forms an NPNP optical switch 54. Preferably, the outer two layers 46 and 52 are of a wider energy band-gap material, such as aluminum gallium arsenide, and the two inner layers 48 and 50 are of a narrower energy band-gap material, such as gallium arsenide. The substrate 53 may be of gallium arsenide of the same conductivity type as the layer 46, such as N-type. On the outer layer 52 are two additional superimposed layers 56 and 58 of a semiconductor material. The layer 56 is of a conductivity type opposite that of the layer 52, and the layer 58 is of a conductivity type opposite that of the layer 56. Thus, the layer 56 is of N-type conductivity and the layer 58 is of P-type conductivity. The layers 56 and 58 may be of gallium arsenide and are smaller in area than the area of the layer 52 so as to leave a portion of the surface of the layer 52 exposed. The layers 52, 56 and 58 form a phototransistor which is a first optically variable resistance device 60.

Adjacent the body 44 is a second body 62 of a semiconductor material, such as gallium arsenide, having three superimposed layers 64, 66 and 68 of alternating opposite conductivity types, such as NPN. This forms a phototransistor which is a second optically variable resistance device 70. The layer 68 of the second optically variable resistance device 70 is electrically connected to the outer layer 52 of the optical switch 54 by a wire 72, and the layer 64 of the second optically variable resistance device 70 is connected to the negative side of a source of power. The layer 58 of the first optically variable resistance device 60 is electrically connected to the positive side of the source of power, and the outer layer 46 of the optical switch 54 is connected to ground. Thus, the first optically variable resistance device 60 is electrically connected in series with the optical switch 54 and the positive side of the current source, and the second optically variable resistance device 70 is electrically connected in series with the optical switch 54 and the negative side of the current source. An optical stop 73 of an optically opaque material is between the second variable resistance device 70 and the optical switch 54 to prevent light from passing therebetween.

The optoelectronic device 42 operates in the same manner as described above with regard to the optoelectronic device 10 shown in FIG. 1. When light is directed into both the optical switch 54 and the first optically variable resistance device 60 as indicated by the arrows 74 and 76, the device is turned on and light is emitted from the optical switch 54 as indicated by the arrow 78. To turn the optoelectronic device 42 off, light is directed into the second optically variable resistance device 70 as indicated by the arrow 80.

Figure 4:
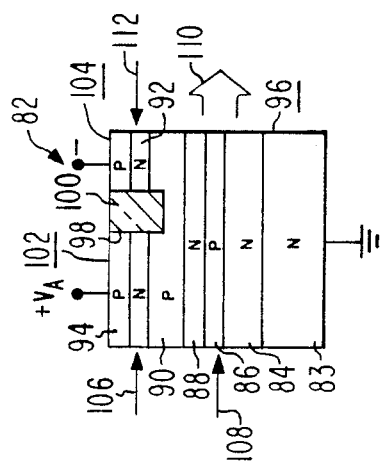
FIG. 4 is a sectional view of a completely monolithic form of the optoelectronic device of the present invention.

Referring to FIG. 4, a fully monolithic form of the optoelectronic device of the present invention is generally designated as 82. Optoelectronic device 82 includes a substrate 83 of a semiconductor material of one conductivity type, shown as N-type, having six superimposed layers 84, 86, 88, 90, 92 and 94 of a semiconductor material thereon. The layers 84, 86, 88, 90, 92 and 94 are of alternating opposite conductivity types starting with the layer 84 being of N-type conductivity. The layer 84 and the layer 90 are of a material having a wider energy band-gap, such as aluminum gallium arsenide, and the layers 86 and 88 are of a material having a narrower energy band-gap, such as gallium arsenide. Thus, the layers 84, 86, 88 and 90 form an optical switch 96. The layers 92 and 94 can be of gallium arsenide. The substrate 83 can be of gallium arsenide and of the same conductivity type as the layer 84. A groove 98 extends through the layers 94 and 92 into the layer 90 to divide the layers 94 and 92 into two portions. The groove 98 is filled with a light absorbing material 100, such as amorphous silicon or chromium doped gallium arsenide. The layer 90 and one portion of the layers 92 and 94 forms a phototransistor 102 which is a first optically variable resistance device, and the layer 90 and the other portion of the layers 92 and 94 form another phototransistor 104 which is a second optically variable resistance device. The portion of the layer 94 of the first phototransistor 102 is connected to the positive side of a source of power and the portion of the layer 94 of the second phototransistor 104 is connected to the negative side of the source of power. The substrate 83 is connected to ground.

The optoelectronic device 82 operates in the same manner as previously described with regard to the optoelectronic devices 10 and 42 of FIGS. 1 and 3 respectively. By directing a beam of light into each of the first phototransistor 102 and the optical switch 96 as indicated by the arrows 106 and 108 respectively, the optoelectronic device 82 is turned on and will emit light as indicated by the arrow 110. The optoelectronic device 82 can be turned off by directing light into the second phototransistor 104 as indicated by the arrow 112.

Thus there is provided by the present invention, an optoelectronic device having an optical switch which can be turned both on and off optically by directing a beam of light on the optoelectronic device. The optoelectronic device is completely solid state and can be made from discrete devices, in a semi-monolithic form or in a completely monolithic form. Although the optoelectronic devices of the present invention have been described as being formed of gallium arsenide and aluminum gallium arsenide, they can be made of other similar materials. For example, the substrates and the outer layers can be formed of indium phosphide and the inner layers can be formed of indium gallium arsenide.

What is claimed is:

1. An optoelectronic semiconductor device comprising:
    a semiconductor device capable of generating and emitting light when a light beam is directed therein and a voltage above a threshold is applied thereacross;
    means for applying a voltage across the device at a level below the threshold voltage;
    a first optically variable resistance device connected in series between one side of the voltage applying means and the semiconductor device and adapted to increase the voltage across the semiconductor device when a beam of light is directed at the first optically variable resistance device and thereby turn the semiconductor device on to its light emitting condition; and
    a second optically variable resistance device connected in series with the semiconductor device and the other side of the voltage applying means and adapted to decrease the voltage across the semiconductor device when a beam of light is directed at the second optically variable resistance device to turn the semiconductor off to its non-emitting condition.

2. An optoelectronic semiconductor device in accordance with claim 1 wherein the semiconductor device is an optical switch and each of the first and second optically variable resistance devices is a photoconductor.

3. An optoelectronic semiconductor device in accordance with claim 2 in which the optical switch is a body of semiconductor material having four superimposed layers of alternating opposite conductivity types forming PN junctions between adjacent layers.

4. An optoelectronic semiconductor device in accordance with claim 3 in which the outer two layers of the optical switch are of a wide energy band-gap material and the two inner layers are of a narrower energy band-gap material so as to form heterojunctions between each of the outer layers and its adjacent inner layer and a homojunction between the two inner layers.

5. An optoelectronic semiconductor device in accordance with claim 4 in which each of the photoconductors is a body of a semiconductor material having at least one PN junction therein.

6. An optoelectronic semiconductor device in accordance with claim 5 in which each of the photoconductors is a phototransistor having three layers of alternating opposite conductivity type.

7. An optoelectronic semiconductor device comprising:
    a first body of a semiconductor material having six superimposed layers of alternating opposite conductivity types forming PN junctions therebetween, four of said layers forming an optical switch which is adapted to emit light when a beam of light is directed therein and a voltage above a threshold is applied threacross and the other two layers forming a first photoconductor connected in series with the optical switch;
    a second body of a semiconductor material having at least one PN junction therein and forming a second photoconductor; and
    means connecting the second photoconductor in series with the four layers of the optical switch.

8. An optoelectronic semiconductor device in accordance with claim 7 in which the outer two layers of the four layers forming the optical switch are of a wide energy band-gap material and the two inner layers are of a narrower energy band-gap material so as to form heterojunctions between each of the outer layers and its adjacent inner layer and a homojunction between the two inner layers.

9. An optoelectronic semiconductor device in accordance with claim 8 in which the other two layers of the first body which form the photoconductor are smaller in area than the four layers forming the optical switch.

10. An optoelectronic semiconductor device in accordance with claim 9 in which the second body includes three layers of alternating opposite conductivity type forming PN junctions between adjacent layers and one of the layers of the second body is electrically connected to the fourth layer of the first body.

11. An optoelectronic semiconductor device in accordance with claim 10 including means between the two bodies to prevent light from passing from one body to the other.

12. An optoelectronic semiconductor device comprising:
    a body of a semiconductor material having six superimposed layers of alternating opposite conductivity types forming PN junctions between adjacent layers;
    a groove extending through one of the outer layers and its adjacent layer to divide the two layers into two portions which form separate photoconductors;
    the other four layers of said body forming an optical switch which is adapted to emit light when a voltage higher than a threshold is applied thereacross; and means for electrically connecting said body across a source of voltage so that one of the photoconductors is connected in series with the optical switch and one side of the voltage source, and the other photoconductor is connected in series with the optical switch and the other side of the voltage source.

13. An optoelectronic device in accordance with claim 12 in which the outer two layers of the four layers forming the optical switch are of a wide energy band-gap material and the two inner layers are of a narrower energy band-gap material so as to form heterojunctions between each of the outer layers and its adjacent inner layer and a homojunction between the two inner layers.

14. An optoelectronic semiconductor device in accordance with claim 13 in which the groove is filled with an optical absorbing material to prevent light from passing between the two photoconductors.

* * * * *